US010191360B2

(12) United States Patent
Chen (10) Patent No.: US 10,191,360 B2
(45) Date of Patent: Jan. 29, 2019

(54) MICROARRAY LED FLASH

(71) Applicant: Hong Kong Beida Jade Bird Display Limited, Hong Kong (HK)

(72) Inventor: Jen-Shyan Chen, Hsinchu County (TW)

(73) Assignee: HONG KONG BEIDA JADE BIRD DISPLAY LIMITED, Hong Kong (HK)

( * ) Notice: Subject to any disclaimer, the term of this patent is extended or adjusted under 35 U.S.C. 154(b) by 36 days.

(21) Appl. No.: 15/394,817

(22) Filed: Dec. 30, 2016

(65) Prior Publication Data

US 2018/0188641 A1 Jul. 5, 2018

(51) Int. Cl.

| H04N 9/31 | (2006.01) |
|---|---|
| G03B 21/14 | (2006.01) |
| G03B 29/00 | (2006.01) |
| G03B 21/20 | (2006.01) |
| G03B 15/02 | (2006.01) |
| F21V 33/00 | (2006.01) |
| F21K 9/62 | (2016.01) |

(Continued)

(52) U.S. Cl.
CPC ............ *G03B 21/2033* (2013.01); *F21K 9/62* (2016.08); *F21V 5/007* (2013.01); *F21V 33/0056* (2013.01); *G03B 15/02* (2013.01); *G03B 21/145* (2013.01); *G03B 21/2013* (2013.01); *H01L 27/092* (2013.01); *H04N 5/2256* (2013.01); *H04N 9/3173* (2013.01); *F21Y 2115/10* (2016.08); *G03B 29/00* (2013.01); *H01L 27/156* (2013.01)

(58) Field of Classification Search
CPC .. H04N 9/3176; H04N 9/3173; H04N 9/3138; H04N 9/3164; G03B 21/2033; G03B 21/145; G03B 21/14; G03B 21/2013; G03B 21/30; G03B 29/00
USPC ............................ 362/11, 227, 800; 313/500
See application file for complete search history.

(56) References Cited

U.S. PATENT DOCUMENTS

| 5,736,754 A * | 4/1998 | Shi ....................... H01L 27/3281 257/40 |
| 2008/0079916 A1* | 4/2008 | Noba ....................... H04N 5/74 353/119 |

(Continued)

FOREIGN PATENT DOCUMENTS

| TW | 200843533 A | 11/2008 |
| TW | I327018 B | 11/2008 |

*Primary Examiner* — Ryan D Howard (57) ABSTRACT

A microarray LED flash, applied to a mobile phone for lighting an adjustable flashlight or projecting an image, comprises a μLED array module, a mixing optical module and an optical module. The μLED array module is configured in a shell of the mobile phone for generating a patterning light source. The mixing optical module and the optical module are detachably configured on an external surface of the shell to receive the patterning light source from the μLED array module for lighting the flashlight or projecting the image respectively. A μLED array chip could be used as the μLED array module and combined with the outboard mixing optical module to generate a flashlight with adjustable color and light pattern. Furthermore, the invention can use the optical module to substitute for the mixing optical module for projecting an image from the patterning light source, therefore the mobile phone has a projection function.

9 Claims, 5 Drawing Sheets

(51) Int. Cl.
  *F21V 5/00* (2018.01)
  *H04N 5/225* (2006.01)
  *H01L 27/092* (2006.01)
  *H01L 27/15* (2006.01)
  *F21Y 115/10* (2016.01)

(56) References Cited

U.S. PATENT DOCUMENTS

2010/0321640 A1\* 12/2010 Yeh ...................... G03B 21/005
  353/31
2011/0176116 A1\* 7/2011 Grotsch ............. G03B 21/2033
  353/31

\* cited by examiner

MICROARRAY LED FLASH

BACKGROUND OF THE INVENTION

1. Field of the Invention

The present invention relates to a flash, and more particularly, to a microarray LED flash applied to a mobile phone for lighting via a μLED array module.

2. Description of the Prior Art

With the changes of lifestyle, the use of mobile phones as a recording device is becoming increasingly popular because of the portable feature of mobile phones, so that people can record scenery, portraits and scene anytime and anywhere. However, with the increasing popularity of mobile phones, a variety of contextual performance requirements according to each shooting environment and imaging requirements also increase.

Although the revision software can be used to achieve a variety of situational performance through modifying the captured images or films, this post-processing approach to obtain the picture often requires detailed artificial adjustments and will be a big challenge for time and energy consumption. At the same time, the image is easy to be discordant because the image is non-natural. Moreover, in order to match the corresponding software development and maintenance, there is a considerable consumption of effort and cost.

Therefore, if the shooting and follow-up imaging can be improved through directly improving the fill light source, it will be an excellent choice to omit the above-mentioned post-processing procedures. The conventional LED light source of the smart phone is a single light source, and cannot be adjusted for warm colors or cold colors according to the shooting environment, therefore it still needs to be artificially modified by the revision software subsequently. Although some of the conventional smart phones have been developed for the fill light to complement the color temperature adjustment function with double color light source, but in the need for special light, such as: apple light for selfie, dark green light for creating fear, even to highlight the theme through using the strength of light source at different locations or double-halo effect for special circumstances, it is not easy to reach the required situation.

On the other hand, the use of smart phones as audio-visual entertainment and digital media of office discussion has become increasingly popular, but it is insufficient for many people to read simply through the display screen on the phones due to the small size of smart phones, therefore the use of projection technology is required to produce a larger image presentation.

The conventional projector modules generate the required image via backlit panels and filters. If using the same technology to make mobile phones directly project, the problem of heat dissipation will be demonstrated due to the small size of mobile phones, and the required power of the general projector modules is too large for mobile phones, so that it is less convenient to achieve the projection function on mobile phones.

Thus, the above-mentioned technology still has a lot of missing, and it is not a good design, therefore it needs to be improved. In conclusion, the present invention provides a microarray LED flash applied to a mobile phone for lighting a multi-array mixed light source to obtain the flash with light color and light pattern adjustment, and directly generating a projection image via the self-luminous properties of the microarray LED element and the outboard optical module.

SUMMARY OF THE INVENTION

The present invention provides a microarray LED flash. In an embodiment of the present invention, the microarray LED flash of the present invention is applied to a mobile phone for lighting a multi-array mixed light source and comprises a μLED array module and a mixing optical module. The μLED array module is configured in a shell of the mobile phone for generating a patterning light source. The mixing optical module is detachably configured on an external surface of the shell to receive the patterning light source for lighting the multi-array mixed light source. Wherein, the thickness of the μLED array module is less than the average thickness of the mobile phone, and the multi-array mixed light source can be used as a camera light source and a lighting source of the mobile phone.

The microarray LED flash further comprises an optical module, when the mixing optical module is removed from the external surface of the phone shell, the optical module is detachably configured on the external surface of the shell to receive the patterning light source from the μLED array module for projecting as an image.

Wherein, the μLED array module comprises a μLED array chip of a plurality of μLED elements, and the μLED array module is for generating the patterning light source via the μLED elements.

The μLED array module further comprises a microarray lens corresponding to each μLED element, and the μLED elements are for generating the patterning light source via the microarray lens.

Furthermore, each μLED element is selected from a group comprising a red light emitting diode, a green light emitting diode and a blue light emitting diode.

Furthermore, at least one red LED, at least one green LED and at least one blue LED in the μLED elements form a pixel group, and the light emitted by the μLED elements is mixed to generate a pixel of the patterning light source in the pixel group.

Besides, the μLED array module further comprises a substrate, and the μLED elements are formed by an epitaxial structure directly disposed on the substrate.

The above-mentioned substrate is complementary metal oxide semiconductor integrated circuits (CMOS IC).

In an embodiment of the present invention, the thickness of the μLED array module is less than 1 mm.

Wherein, the optical module adjusts the focal length, size and display shape of the image for projecting.

In conclusion, the microarray LED flash of the present invention generates the flashlight with adjustable color and light pattern via the μLED array module configured in the phone shell of the mobile phone through combining with the outboard mixing optical module, and the present invention can further use the outboard optical module to substitute for the mixing optical module for projecting the image. Compared with the prior art, the microarray LED flash of the present invention directly generates the required patterning light source via the μLED array chip and is combined with the mixing optical module to generate the flashlight with adjustable color and light pattern thereby reducing the thickness and volume to be embedded in the mobile phone simultaneously. Besides, the patterning light source can be projected into viewable image through substituting the optical module for the mixing optical module thereby upgrading to a mobile phone with the projection function.

The advantages and spirits of the invention may be understood by the following recitations together with the appended drawings.

BRIEF DESCRIPTION OF THE APPENDED DRAWINGS

Some of the embodiments will be described in detail, with reference to the following figures, wherein like designations denote like members, wherein.

DETAILED DESCRIPTION OF THE INVENTION

A detailed description of the hereinafter described embodiments of the disclosed apparatus and method are presented herein by way of exemplification and not limitation with reference to the Figures. Although certain embodiments are shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of embodiments of the present invention.

Figure 1:
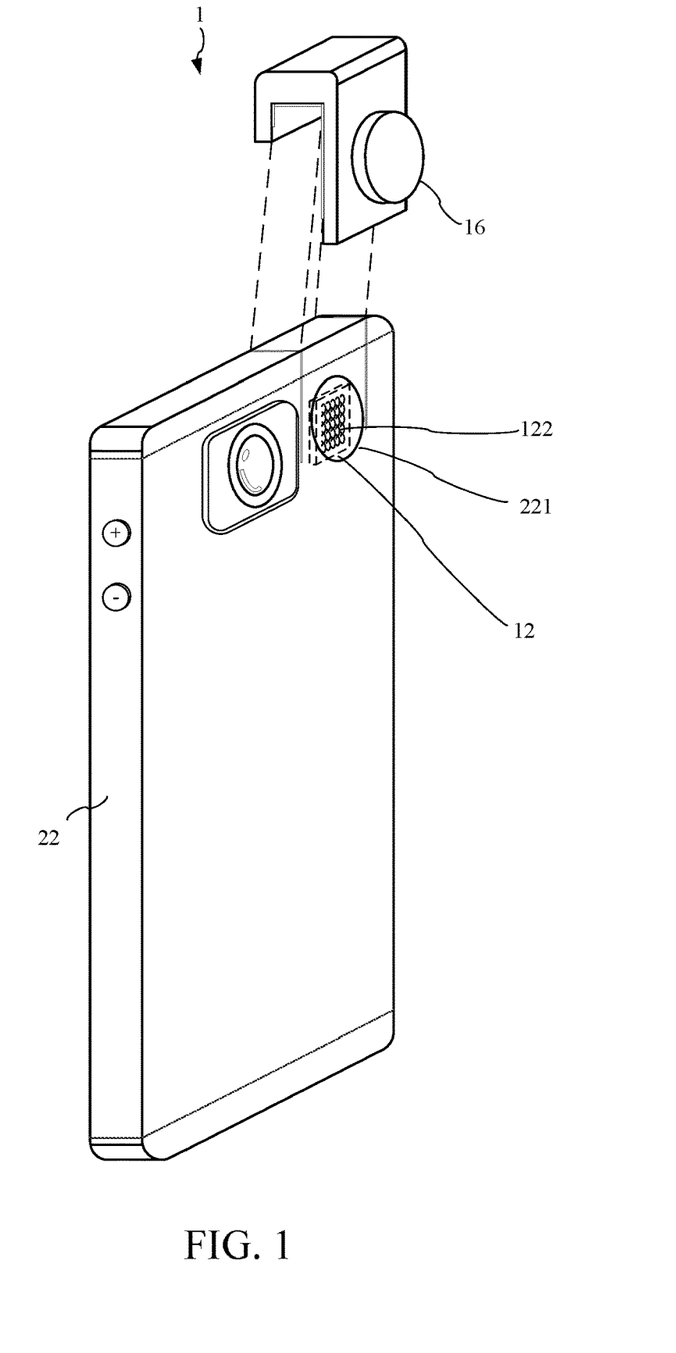
FIG. 1 shows a schematic diagram of the microarray LED flash in an embodiment of the present invention.

Please refer to FIG. 1. FIG. 1 shows a schematic diagram of the microarray LED flash 1 in an embodiment of the present invention. In an embodiment of the present invention, the microarray LED flash 1 of the present invention can be applied to a mobile phone for lighting a multi-array mixed light source, and comprises a μLED array module 12 and a mixing optical module 16. The μLED array module 12 is configured in a shell 22 of the mobile phone for generating a patterning light source. The mixing optical module 16 is detachably configured on an external surface of the shell 22 to receive the patterning light source for lighting the multi-array mixed light source. Wherein, the thickness of the μLED array module 12 is less than the average thickness of the mobile phone, and the multi-array mixed light source can be used as a camera light source and a lighting source of the mobile phone.

In the practical application, the multi-array mixed light source can be used as the flash of the mobile phone via a control module of the mobile phone, furthermore, the multi-array mixed light source can be used as the lighting source of the mobile phone.

The μLED array module 12 comprises a μLED array chip of a plurality of μLED elements 122, and the μLED array module 12 is for generating the patterning light source via the μLED elements 122.

In the practical application, the thickness of the μLED array module 12 can be reduced because the μLED array module 12 can generate the image light source without using any filter or light blocking elements.

Wherein, each μLED element 122 is selected from a group comprising a red LED, a green LED and a blue LED. In the practical application, the color of the light emitted by each μLED element 122 can also belong to other basic colors that can mix out the required visible light.

In the practical application, the μLED element 122 of a color light can also be used to match the corresponding phosphor to obtain a light source of another color, for example, use a blue LED combined with a yellow phosphor to obtain a white light source.

Furthermore, at least one red LED, at least one green LED and at least one blue LED in the μLED elements 122 form a pixel group, and the light emitted by the μLED elements 122 is mixed to generate a pixel of the patterning light source in the pixel group.

In the practical application, the μLED elements 122 of the μLED array module 12 are grouped into a plurality of pixel groups corresponding to each pixel of the image light source in accordance with the above-mentioned grouping principle so that each pixel group can directly generate each pixel in the image light source without passing through the backlight plate, filter, or other elements, thereby reducing the usage amount of the element, and further reducing the use volume of the μLED array module 12 in the mobile phone.

On the other hand, the μLED array module 12 emits the desired three colors light directly through the μLED elements 122, thereby making the color more pure, and also shortening the response time of the pixel.

Figure 2:
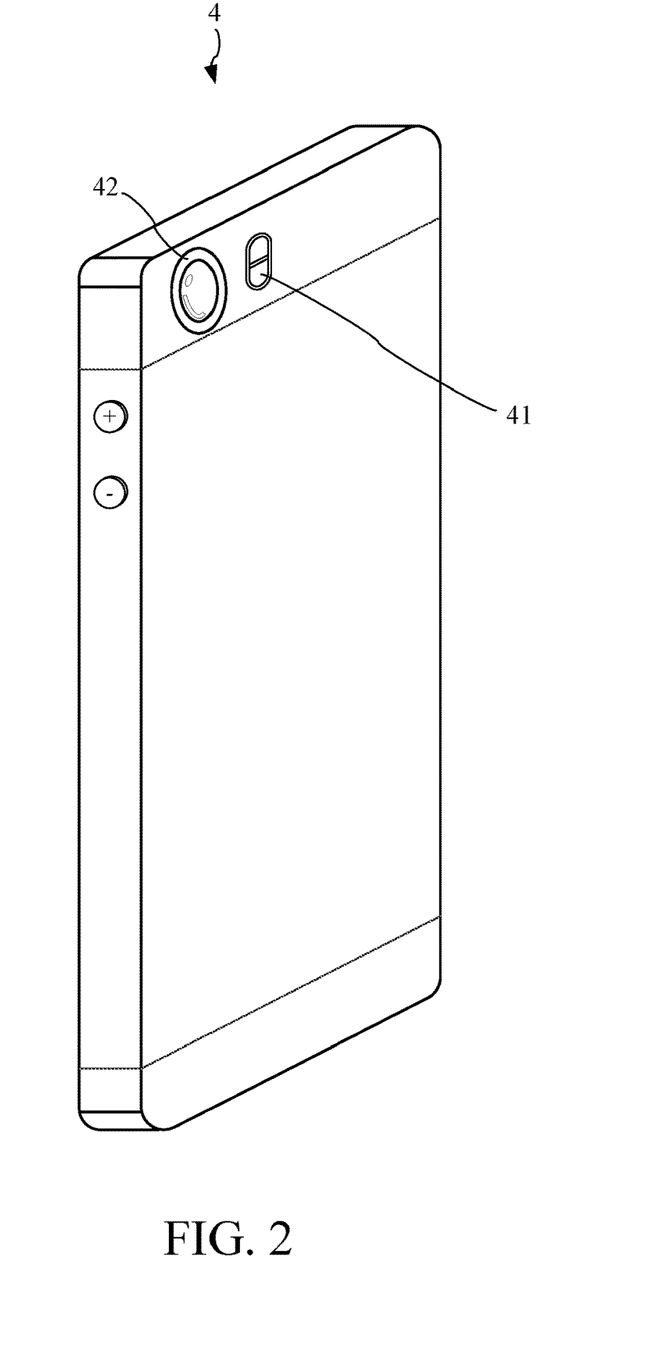
FIG. 2 shows a schematic diagram of the conventional mobile phone with double color flash light source.

Please refer to FIG. 2. FIG. 2 shows a schematic diagram of the conventional mobile phone 4 with double color flash light source. In order to overcome the need for different color temperature light source required in the shooting environment, the mobile phone 4 with conventional double color flash light source achieves color temperature modulation function via two flashes 41 with different color temperature matched to each other. Although this method can generate the modulation of cold and warm light color, the color variation is limited because the light source is only adjusted by two colors. Compared with the prior art, the microarray LED flash 1 of the present invention makes the required light source for shooting able to be modulated by the above-mentioned three color light modulation method, for example, the white color temperature can be freely adjusted to obtain warm white light or cool white light, or the light color is adjusted to generate the suitable apple light for taking pictures, the suitable dark green light for dark situation or the suitable yellow green light for fruit and vegetable.

Furthermore, since the μLED array module 12 is composed of a plurality of pixel groups, so that the generated light source can exhibit a strong light source for emphasizing the specific position of the main body, similar to a double-halo light source of the automobile headlight or a composite-type light source with white up red down gradation, but it cannot be easily achieved via the conventional smart phone with only double color point light source.

Figure 3:
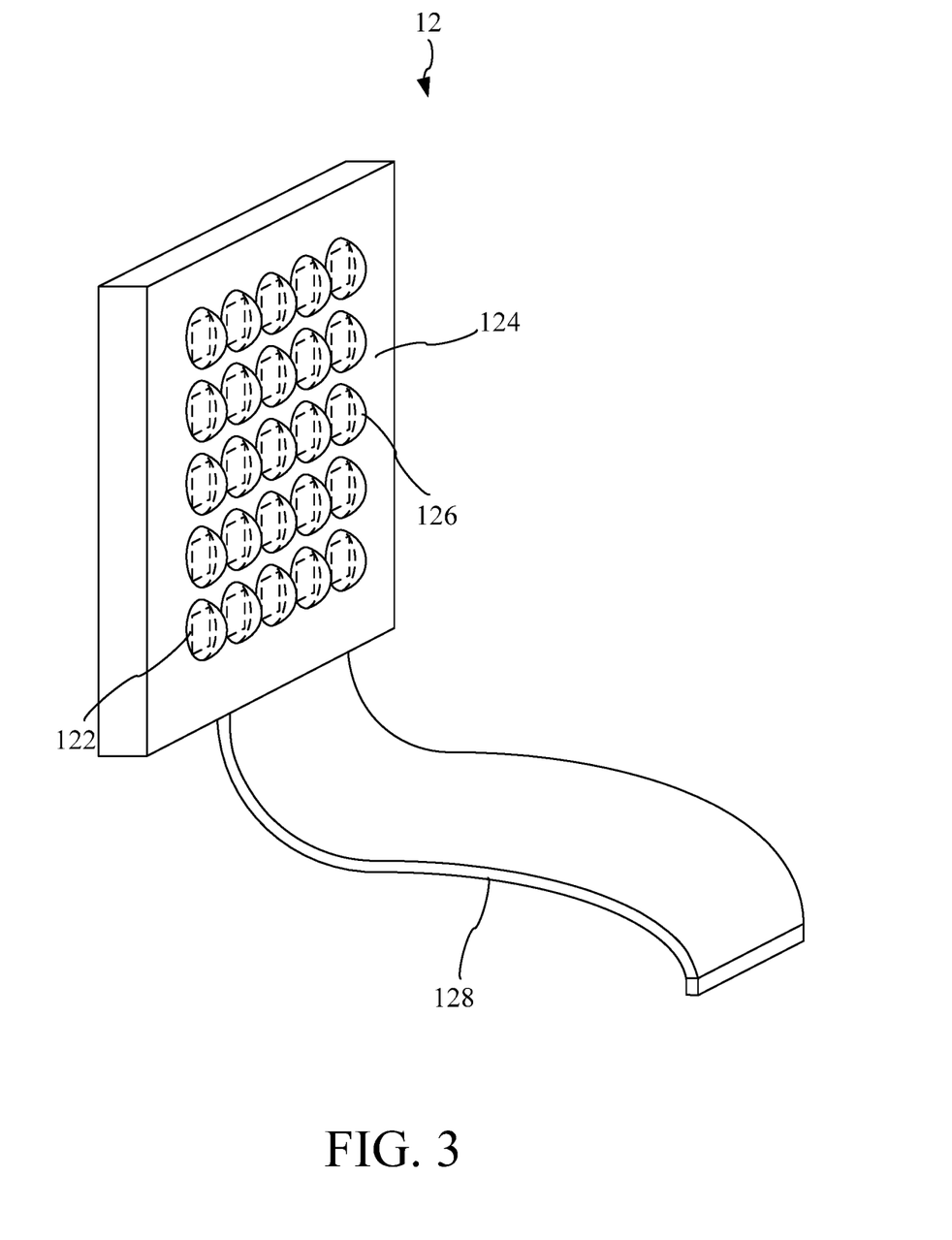
FIG. 3 shows a schematic diagram of the μLED array module in an embodiment of the present invention.

Please refer to FIG. 3. FIG. 3 shows a schematic diagram of the μLED array module 12 in an embodiment of the present invention. The μLED array module 12 further comprises a substrate 124, and the μLED elements 122 are formed by an epitaxial structure directly disposed on the substrate 124 thereby forming the μLED array chip. The above-mentioned substrate 124 is complementary metal oxide semiconductor integrated circuits (CMOS IC), and the cable 128 of the substrate 124 is used to fit within the corresponding control slot to reduce assemble complexity. At the same time, a microarray lens 126 can be incorporated to adjust the optical properties of the μLED elements 122 by matching the positions of each μLED element 122, so that the light emitted by each μLED element 122 can be improved the collimation via the microarray lens 126 to generate a clearer image light source.

Wherein, the above-mentioned microarray lens 126 can be directly formed on the corresponding μLED elements 122 through using a simple process, thereby reducing the process steps and the thickness of the microarray lens 126, in the mean while increasing the matching accuracy of the microarray lens 126 corresponding to each μLED element 122. Finally, the image light source with collimation is converted into the multi-array mixed light source with softening effect via the mixing optical module 16.

Due to the type of the μLED array chip, the volume of the μLED array module 12 can be made smaller, and since the epitaxial structures of the μLED elements 122 are directly formed by an epitaxial process, the process required for the manufacturing can be reduced, and the arrangement accuracy of the μLED elements 122 can be improved, at the same time, the selection conditions for the pitch and arrangement of the μLED elements 122 between each other are also more comfortable.

Besides, since the μLED elements 122 are formed through conjunctively disposing the μLED epitaxial structures on the substrate 124 directly via the epitaxial process, the thermal resistance of the μLED array module 12 can be effectively reduced to increase the antipyretic and heat-dissipating ability of the μLED elements 122.

On the other hand, the μLED elements 122 do not need to be fixed to the substrate 124 by means of, so that the life of the μLED elements 122 formed by the adhesive spot welding process will not reduce nor the failure condition will occur.

In conclusion, the thickness of the used μLED array module 12 may not be greater than the average thickness of the shell 22 of the mobile phone (for example, no more than 1 mm) to provide the required functionality. Therefore, the shell 22 of the mobile phone does not need to be modified as part of the shell protruding to accommodate the μLED array module 12, and the volume waste in the shell 22 of the mobile phone can be avoided.

Figure 5:
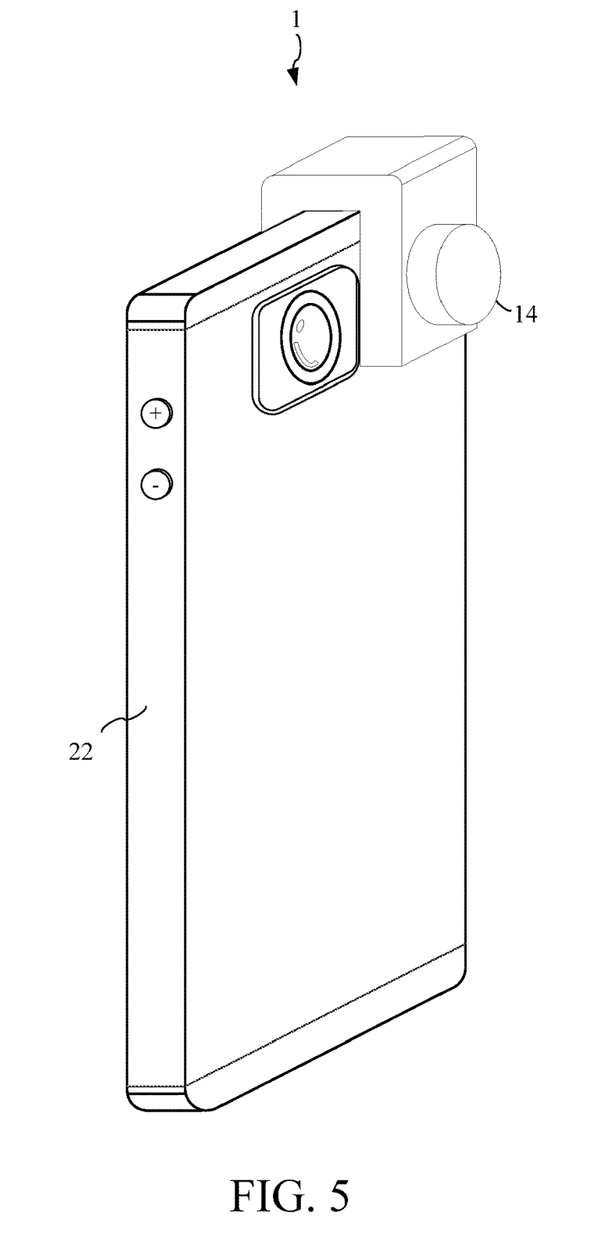
FIG. 5 shows a schematic diagram of the microarray LED flash using the optical module in an embodiment of the present invention.

Please refer to FIG. 1 and FIG. 5. FIG. 5 shows a schematic diagram of the microarray LED flash 1 using the optical module 14 in an embodiment of the present invention. Wherein, the microarray LED flash 1 further comprises an optical module 14, and the optical module 14 is detachably configured on the external surface of the shell 22 to receive the patterning light source from the μLED array module 12 for projecting as an image. In the practical application, the optical module 14 can be mounted on the shell 22 of the mobile phone by mounting.

In the practical application, the external surface of the shell 22 has a corresponding groove, so that the optical module 14 and the mixing optical module 16 can be fixed to the shell 22 of the mobile phone through sliding into the groove to reduce the replacement difficulty, and improve the accuracy of the positions of the optical module 14 and the mixing optical module 16 corresponding to the μLED array module 12.

Besides, the shell 22 of the mobile phone has a light outlet 221, and the μLED array module 12 is configured at the position corresponding to the light outlet 221 in the mobile phone, so that the generated image light source can pass through the light outlet 221 to the optical module 14 or the mixing optical module 16.

Figure 4:
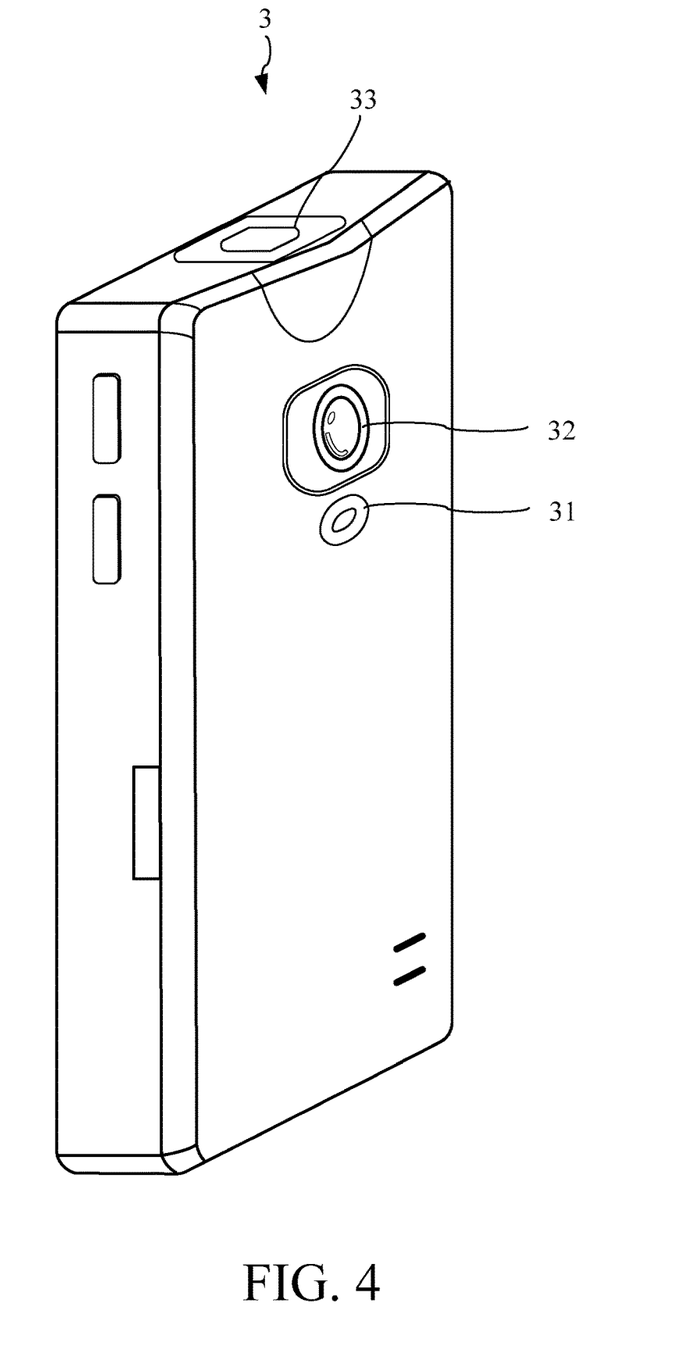
FIG. 4 shows a schematic diagram of the conventional mobile phone with the projection function.

Please refer to FIG. 4. FIG. 4 shows a schematic diagram of the conventional mobile phone 3 with the projection function. Since the conventional projection module cannot be made too thin, the projection light outlet 33 of the conventional mobile phone 3 with the projection function cannot be configured on the same side of the camera 32, so that an additional flash 31 is required to make up the requirements of shooting. In another prior art, Taiwan Patent I327018, it is known that if the projection light outlet 33 and the camera 32 needs to be on the same side, the thickness of the mobile phone should be sufficient to accommodate various optical lenses, light sources and filters, therefore, the mobile phone cannot achieve to be thin.

Compared with the prior art, the mobile phone of the microarray LED flash 1 of the present invention can maintain the appearance of the original design at ordinary times because the thickness of the μLED array module 12 is smaller than the average thickness of the mobile phone, and the optical module 14 and the mixing optical module 16 can be detached when not in use, so that the mobile phone will not be towering in the visual experience and the structure and shape.

The above-mentioned optical module 14 adjusts the focal length, size and display shape of the image for projecting. In an embodiment of the present invention, the optical module 14 can be divided into a plurality of different types of optical modules 14 according to the focusing distance, and combines with the μLED array module 12 in the optional way, for example, the optical module 14 can be divided into a short focus type module with a distance about 15 cm and a long focus type module with a distance about 2 meters to match different use environments. In another embodiment of the present invention, the optical module 14 can be built in an autofocus element to optimize the focal length of the projected image, so that only one optical module 14 is needed to achieve the projection function in different environments. In the practical application, the optical module 14 can further comprise the functions of image brightness adjustment and color shift adjustment to project a more distinct projection image on the different background screens.

In conclusion, the microarray LED flash of the present invention generates the flashlight with adjustable color and light pattern via the μLED array module configured in the phone shell of the mobile phone through combining with the outboard mixing optical module, and the present invention can further use the outboard optical module to substitute for the mixing optical module for projecting the image. Compared with the prior art, the microarray LED flash of the present invention directly generates the required patterning light source via the μLED array chip and is combined with the mixing optical module to generate the flashlight with adjustable color and light pattern thereby reducing the thickness and volume to be embedded in the mobile phone simultaneously. Besides, the patterning light source can be projected into viewable image through substituting the optical module for the mixing optical module thereby upgrading to a mobile phone with the projection function.

With the examples and explanations mentioned above, the features and spirits of the invention are hopefully well described. More importantly, the present invention is not limited to the embodiment described herein. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A microarray LED flash, applied to a mobile phone for lighting a multi-array mixed light source, comprising:
   a μLED array module, configured in a shell of the mobile phone for generating a patterning light source;
   a mixing optical module, detachably configured on an external surface of the shell to receive the patterning light source for lighting the multi-array mixed light source; and
   an optical module, detachably configured on the external surface of the shell to receive the patterning light source from the μLED array module for projecting as an image;
   wherein when one of the mixing optical module and the optical module is detached from the external surface of the shell, another is configured on the external surface of the shell;
   wherein, the thickness of the μLED array module is less than the average thickness of the mobile phone, and the multi-array mixed light source can be used as a camera light source and a lighting source of the mobile phone.

2. The microarray LED flash of claim 1, wherein the μLED array module comprises a μLED array chip of a plurality of μLED elements, and the μLED array module is for generating the patterning light source via the μLED elements.

3. The microarray LED flash of claim 2, wherein the μLED array module comprises a microarray lens corresponding to each μLED element, and the μLED elements are for generating the patterning light source via the microarray lens.

4. The microarray LED flash of claim 2, wherein each μLED element is selected from a group comprising a red light emitting diode, a green light emitting diode and a blue light emitting diode.

5. The microarray LED flash of claim 4, wherein at least one red light emitting diode, at least one green light emitting diode and at least one blue light emitting diode in the μLED elements form a pixel group, and the light emitted by the μLED elements is mixed to generate a pixel of the patterning light source in the pixel group.

6. The microarray LED flash of claim 2, wherein the μLED array module further comprises a substrate, and the μLED elements are formed by an epitaxial structure directly disposed on the substrate.

7. The microarray LED flash of claim 6, wherein the substrate is complementary metal oxide semiconductor integrated circuits (CMOS IC).

8. The microarray LED flash of claim 1, wherein the thickness of the μLED array module is less than 1 mm.

9. The microarray LED flash of claim 1, wherein the optical module adjusts the focal length, size and display shape of the image for projecting.

* * * * *